(12) United States Patent
Hayase et al.

(10) Patent No.: US 7,699,538 B2
(45) Date of Patent: Apr. 20, 2010

(54) HERMETICALLY SEALING MEMBER HAVING OPTICAL TRANSMISSION MEANS, OPTOELECTRONIC APPARATUS, AND OPTICAL TRANSMISSION METHOD

(75) Inventors: Yusuke Hayase, Tokyo (JP); Atsushi Ono, Tokyo (JP); Toshiyuki Okayasu, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 12/083,592

(22) PCT Filed: Sep. 28, 2006

(86) PCT No.: PCT/JP2006/319270

§ 371 (c)(1),
(2), (4) Date: Apr. 14, 2008

(87) PCT Pub. No.: WO2007/046221

PCT Pub. Date: Apr. 26, 2007

(65) Prior Publication Data

US 2009/0162018 A1      Jun. 25, 2009

(30) Foreign Application Priority Data

Oct. 18, 2005   (JP) .............................. 2005-303451

(51) Int. Cl.
*G02B 6/36* (2006.01)
(52) U.S. Cl. ................................ 385/94; 385/88; 385/92

(58) Field of Classification Search ....................... None
See application file for complete search history.

(56) References Cited

U.S. PATENT DOCUMENTS

| 6,027,256 A * | 2/2000 | Nightingale et al. .......... 385/92 |
| 2005/0100290 A1* | 5/2005 | Huang ........................ 385/92 |

FOREIGN PATENT DOCUMENTS

| JP | 06-27334 | 2/1994 |
| JP | 06-273641 | 9/1994 |
| JP | 07-063956 | 3/1995 |
| JP | 07-114049 | 5/1995 |
| JP | 10-51169 | 2/1998 |
| JP | 10-126018 | 5/1998 |
| JP | 342417 | 5/2003 |
| JP | 2005-156885 | 6/2005 |

* cited by examiner

*Primary Examiner*—Tina M Wong
(74) *Attorney, Agent, or Firm*—Muramatsu & Associates (57) ABSTRACT

A hermetically sealing member with an optical transmission means transmits an optical signal economically and practically between the inside and the outside of a shielding member covering a printed-circuit board while sustaining the hermetically sealed state certainly. An optoelectronic device and an optical transmission method are also provided. A hermetically sealing member with an optical transmission means includes a gasket body fixed between a printed-circuit board and a sealing face of a shielding member, and a tape fiber formed integrally with the gasket body.

9 Claims, 5 Drawing Sheets

HERMETICALLY SEALING MEMBER HAVING OPTICAL TRANSMISSION MEANS, OPTOELECTRONIC APPARATUS, AND OPTICAL TRANSMISSION METHOD

TECHNICAL FIELD

The present invention relates to a hermetically sealing member having optical transmission means, an optoelectronic apparatus, and an optical transmission method. In particular, the present invention relates to a hermetically sealing member having optical transmission means, an optoelectronic apparatus, and an optical transmission method which make it possible for optical elements mounted on a printed-circuit board to transmit optical signals between inside and outside of a shielding member while maintaining the hermetically sealed state of a coolant established by the shielding member.

BACKGROUND ART

Large scale integrated circuit may also be referred to as "LSI") modules generate a large amount of heat when reduced in size because the degree of integration and the operation speed are dramatically increased. In general, therefore, the LSI modules are cooled by using the forced cooling means.

As the forced cooling means, various cooling means such as the air cooling system and the water cooling system have been developed. As cooling means which is the most excellent in cooling capability among those forced cooling means, a liquid cooling system in which LSI modules are immersed in a liquid coolant and the liquid coolant is circulated is developed.

A technique of a heat generation element mounting semiconductor apparatus having a cooling liquid hermetically sealing case which serves as a shielding member mounted on a printed-circuit board is disclosed in, for example, Patent Document 1 (Japanese Patent Publication No. 3424717). In this heat generating elements mounting semiconductor apparatus, heat generating elements (for example, LSI modules) are accommodated in a cooling liquid hermetically sealing case, and the cooling liquid is circulated along a predetermined flow path by a partition wall provided in the cooling liquid hermetically sealing case to cool the heat generating elements.

According to this technique, efficient cooling can be conducted even if the mounting density of heat generating elements is increased.

As the capacity of data transmission becomes large, optical transmission systems are being researched, developed, and applied to practical use. In the above-described optical transmission system, optical elements (for example, light emitting elements and light receiving elements) which convert optical signals and electric signals to each other and optical transmission means (for example, optical waveguides and optical cables) which transmit optical signals are used. The optical elements are different from conventional electronic components which handle only electric signals. In other words, each of the optical elements includes external connection terminals to input and output electric signals and external optical signal connection means to input and output optical signals.

Various techniques for embedding optical transmission means in a substrate on which optical elements and electronic components are mounted mixedly are being developed.

A technique of a mixed optical and electrical wiring board having an optical fiber embedded layer obtained by embedding an optical fiber in a partial layer of an electric wiring board having an electric circuit mounted thereon is disclosed, for example, in Patent Document 2(Japanese Patent Application Laid-open No. 10-126018). A technique of an optical waveguide formed in a substrate is disclosed in Patent Document 3(Japanese Patent Application Laid-open No. 7-114049) and Patent Document 4(Japanese Patent Application Laid-open No. 6-27334). According to these techniques, optical transmission means such as optical fibers and optical waveguides can be embedded in a printed-circuit board.

A printed-circuit board having optical transmission means embedded therein proposed in the conventional art will now be described with reference to the drawing.

Figure 5A:
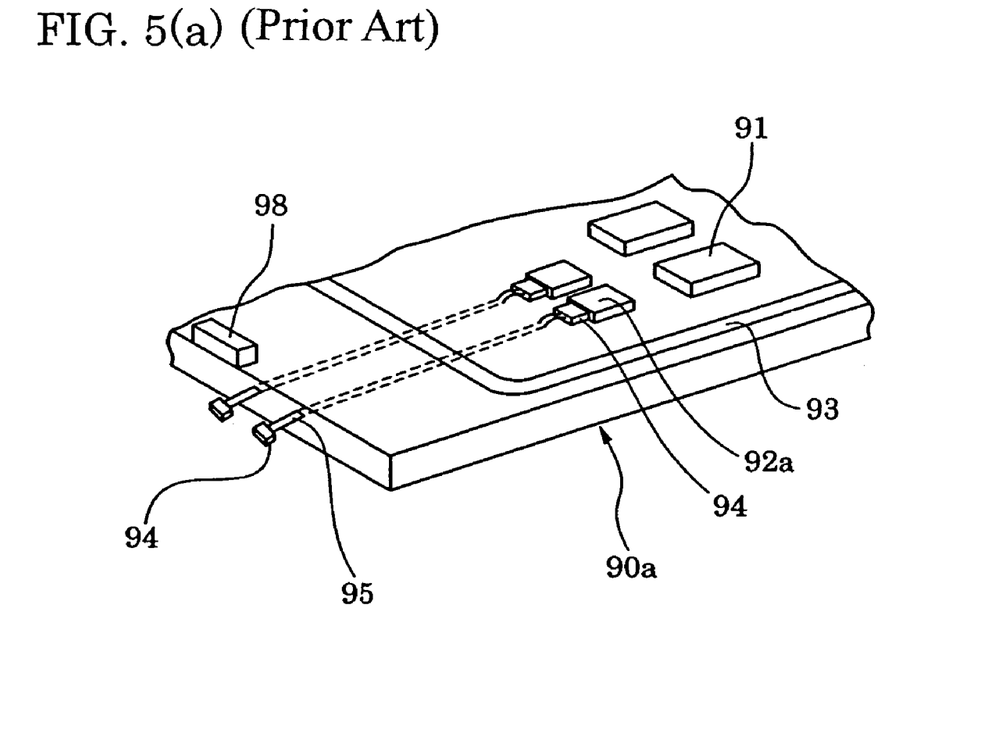
FIG. 5(a) is an perspective view of a printed-circuit board having optical cables embedded therein.
Figure 5B:
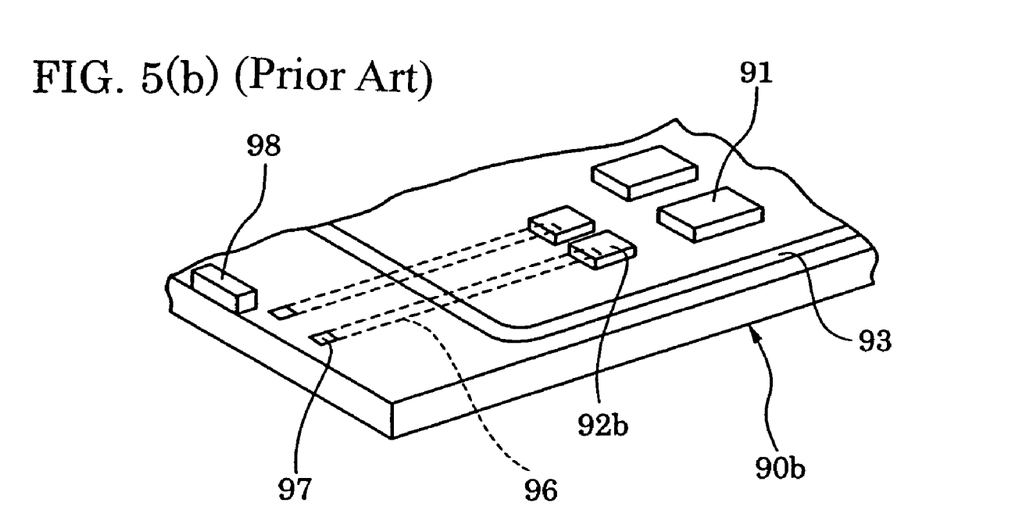
FIG. 5(b) is an perspective view of a printed-circuit board having optical waveguides embedded therein.

FIGS. 5(a) and 5(b) are schematic diagrams showing a printed-circuit board having optical transmission means embedded therein proposed according to a conventional art. FIG. 5(a) is a perspective view of a printed-circuit board having optical cables embedded therein, and FIG. 5(b) is a perspective view of a printed-circuit board having optical waveguides embedded therein.

In FIG. 5(a), an LSI module 91, a connector 98 and an optical element 92a are mounted on a printed-circuit board 90a. In addition, a (flat) land 93 described in Patent Document 1 is formed so as to correspond to a seal face shape of a shield case (not illustrated). An optical cable 95 connected at each end to an optical connector 94 is embedded in the printed-circuit board 90a. One end of the optical cable 95 is arranged from inside of the annular land 93 to the optical element 92a. The other end of the optical cable 95 is arranged from outside of the annular land 93 to the external of the printed-circuit board 90a.

Although not illustrated, in the printed-circuit board 90a, a shield case serving as a shielding member to be mounted on the printed-circuit board is attached onto the land 93 via an O ring. The optical connector 94 located inside the land 93 is connected to the optical element 92a.

Because of this arrangement, a liquid coolant (for example, FLUORINERT (registered trademark of the 3M Corporation) which is an inactive liquid) flows in the hermetically sealed shield case. As a result, the LSI module 91 is cooled effectively. Optical signals can be transmitted between the inside and the outside of the shield case via the optical cable 95 embedded in the printed-circuit board 90a.

In FIG. 5(b), a printed-circuit board 90b differs from the printed-circuit board 90a in that an optical waveguide 96 is embedded instead of the optical cable 95. Other structures of the printed-circuit board 90b are substantially the same as those of the printed-circuit board 90a.

One end of the optical waveguide 96 is located inside the annular land 93 and the other end of the optical waveguide 96 is located outside the land 93. One end of the optical waveguide 96 is connected to an optical element 92b via an opening (not illustrated) formed in the printed-circuit board 90b. The other end of the optical waveguide 96 is connected to an optical element (not illustrated) via an opening 97. Because of this arrangement, optical signals can be transmitted between the inside and outside of the shield case via the optical waveguide 96 embedded in the printed-circuit board 90b.

DISCLOSURE OF THE INVENTION

Problems to be Solved by the Invention

In the conventional printed-circuit boards 90a and 90b, however, the optical cable 95 or the optical waveguide 96 is embedded within the printed-circuit board in which circuit wires serving as signal paths of the electric system are formed. Although the seal face of the shielding member can be hermetically sealed by the O ring which serves as the hermetically sealing member described in Patent Document 1, there is a problem that the manufacturing costs of the printed-circuit boards 90*a* and 90*b* become high. In applying to practical use, there is a fatal problem that, even if a trouble occurs in the embedded optical cable 95 or optical waveguide 96, repair cannot be conducted.

Furthermore, the printed-circuit board 90*b* has a problem that the optical waveguide 96 needs to be connected to the light emitting end face and the light receiving end face of the optical element 92*b* accurately, and consequently the assembly precision must be improved.

In order to solve the problems, an object of the present invention is to provide a hermetically sealing member having optical transmission means, an optoelectronic apparatus, and an optical transmission method which make it possible to transmit optical signals between inside and outside of the shielding member economically and practically while certainly maintaining the hermetically sealed state achieved by the shielding member mounted on the printed-circuit board.

Means for Solving the Problems

In order to achieve this object, a hermetically sealing member of the present invention having optical transmission means has a configuration including a hermetically sealing member attached to seal faces of a printed-circuit board having optical elements mounted thereon and a shielding member which shields at least a part of components mounted on the printed-circuit board, and optical transmission means formed integrally with the hermetically sealing member to transmit optical signals between inside and outside of the shielding member.

According to this configuration, a part of the optical transmission means depressed by the seal face of the shielding member functions as the hermetically sealing member. As a result, the optical signals can be transmitted between the inside and outside of the shielding member while securely maintaining the hermetically sealed state established by the shielding member.

Preferably, optical connectors are connected to both ends of the optical transmission means.

By doing so, the optical connectors can be connected to the optical elements. As a result, the optical elements can be connected to the optical transmission means easily.

Preferably, the hermetically sealing member is a sheet containing at least one of resin and rubber with a shape corresponding to the shielding member.

Because of this arrangement, the hermetically sealing member functions as a gasket. As a result, the seal performance with the optical transmission means formed integrally with the hermetically sealing member can be improved.

Preferably, a projection part formed of the rubber or a seal layer formed of the rubber is provided on at least one of a top face and a bottom face of the hermetically sealing member.

By doing so, the projection part or the seal layer functions as an O ring or a gasket formed of rubber. As a result, the seal performance of the hermetically sealing member can be further improved.

In order to achieve the object, an optoelectronic apparatus according to the present invention has a configuration including a printed-circuit board on which optical elements are mounted, a shielding member which shields the printed-circuit board and at least a part of components mounted-on the printed-circuit board, and the hermetically sealing member having optical transmission means described above.

In this way, the present invention is effective as an optoelectronic apparatus as well, and optical signals can be transmitted between the inside and outside of the shielding member while maintaining the hermetically sealed state given by the shielding member.

Preferably, a coolant which cools electronic components mounted on the printed-circuit board is supplied to space between the shielding member and the printed-circuit board, and the hermetically sealing member hermetically seals the coolant.

By doing so, forced cooling using the coolant can be conducted. As a result, electronic components mounted on the printed-circuit board can be cooled efficiently.

Preferably, unevenness which forms a flow path of the coolant is provided on the shielding member.

Because of this arrangement, the flow velocity and flow quantity of the coolant can be set freely. As a result, cooling according to each electronic component can be conducted, and effective cooling can be achieved.

Preferably, a retaining part which retains the optical transmission means is provided on the shielding member.

Because of this arrangement, the optical transmission means can be securely supported by the retaining part. Even if the coolant flow becomes fast, therefore, a trouble that the optical transmission means is damaged by the coolant can be prevented.

In order to achieve the object, an optical transmission method according to the present invention is an optical transmission method used for optical elements which are covered by a shielding member, which are cooled by a coolant supplied to space between the shielding member and the printed-circuit board, and which are mounted on the printed-circuit board to transmit optical signals to outside of the shielding member and receive optical signals from outside of the shielding member, wherein the optical signals are transmitted or received via optical transmission means formed integrally with a hermetically sealing member attached to seal faces of the printed-circuit board and the shielding member.

In this way, the present invention is effective as an optical transmission method as well, and optical signals can be transmitted between the inside and outside of the shielding member while maintaining the hermetically sealed state given by the shielding member.

Effects of the Invention

According to the hermetically sealing member having optical transmission means, an optoelectronic apparatus, and an optical transmission method of the present invention, optical signals can be transmitted between the inside and outside of the shielding member economically and practically while securely maintaining the hermetically sealed state established by the shielding member. Furthermore, it is possible to cool electronic components mounted on the printed-circuit board with a liquid effectively and transmit optical signals.

BRIEF DESCRIPTION OF THE DRAWINGS

FIGS. 1(*a*)-1(*c*) are schematic diagrams for explaining a structure of a hermetically sealing member having optical transmission means according to an embodiment of the present invention, in which FIG. 1(*a*) is a plan view, FIG. 1(*b*) is an expanded sectional view seen along a line A-A, and FIG. 1(*c*) is an expanded sectional view seen along a line B-B;

FIGS. 3(a)-3(c) are schematic diagrams for explaining a structure of a hermetically sealing member having optical transmission means according to an application example of the present invention, in which 3(a) is a plan view.

FIGS. 4(a)-4(b) are schematic diagrams for explaining a structure of an optoelectronic apparatus according to an embodiment of the present invention, in which FIGS. 5(a)-5(b) are schematic diagrams of a printed-circuit board having optical transmission means embedded therein according to a conventional art, in which

BEST MODE FOR CARRYING OUT THE INVENTION

[Hermetically Sealing Member Having Optical Transmission Means]

Figure 1A:
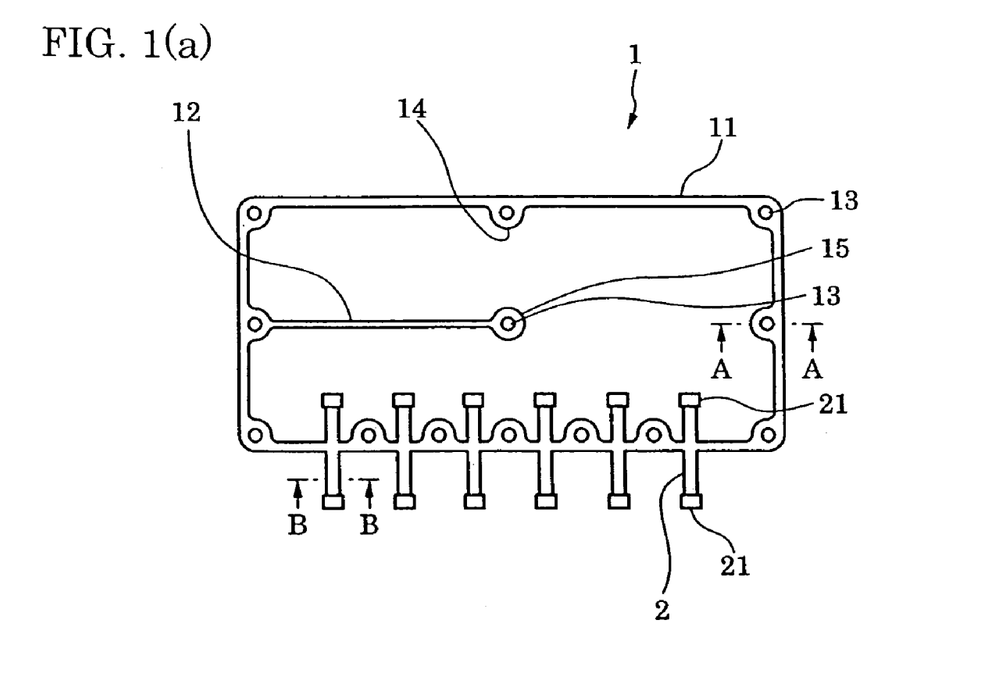
Figure 1B:
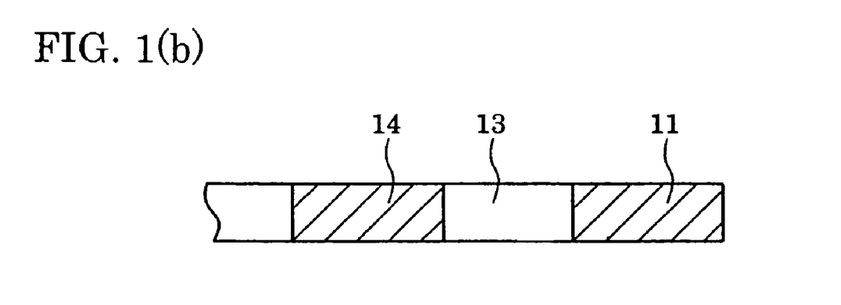
Figure 1C:
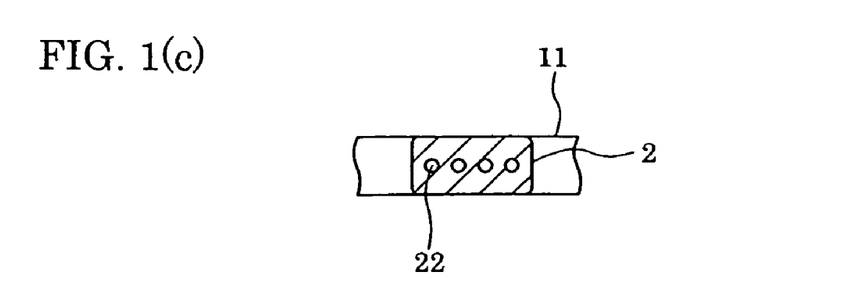

FIGS. 1(a)-1(c) are schematic diagrams for explaining a structure of a hermetically sealing member having optical transmission means according to an embodiment of the present invention, in which FIG. 1(a) is a plan view, FIG. 1(b) is an expanded sectional view seen along a line A-A, and FIG. 1(c) is an expanded sectional view seen along a line B-B.

Figure 2:
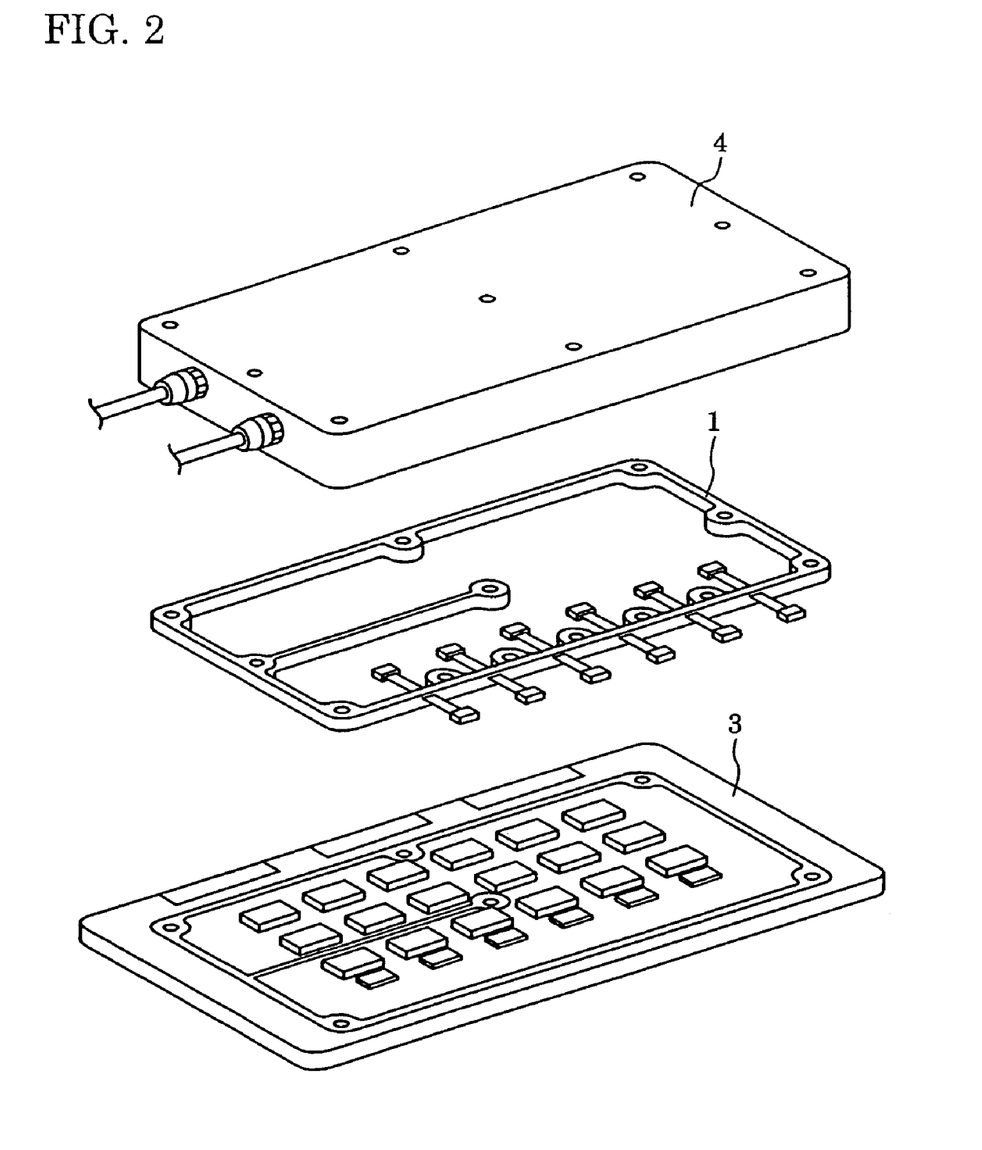
FIG. 2 is a schematic perspective view for explaining a structure of a hermetically sealing member having optical transmission means according to an embodiment of the present invention.

FIG. 2 is a schematic perspective view for explaining a structure of a hermetically sealing member having optical transmission means according to an embodiment of the present invention.

In FIGS. 1(a)-1(c) and 2, a hermetically sealing member having optical transmission means 1 (may also be abbreviated to hermetically sealing member 1) includes a gasket main body 11 attached between seal faces of a printed-circuit board 3 and a shielding member 4 and a tape fiber 2 formed integrally with the gasket main body 11.

In the present embodiment, the shielded substance is the printed-circuit board 3, but the shielded substance is not restricted to the printed-circuit board 3. The gasket main body 11 is used as the hermetically sealing member. The hermetically sealing member in the present invention refers to a substance used to prevent leak when all of the components are properly assembled. Therefore, the gasket, O ring or packing is included in the hermetically sealing member in the present invention.

(Gasket Main Body)

The gasket main body 11 is a sheet which is formed of polyimide, which has a rectangular fringe shape, and is uniform in thickness. In the gasket main body 11, fan-shaped and semicircular gasket parts 14 for screw holes are formed in corners of the rectangle, a center part of an upper side, a center part of a right side, a center part of a left side, and middle parts between the tape fibers 2 on a bottom side (a total of twelve places). A screw hole 13 is formed in the center of each of the gasket parts 14 in order to pass a screw 41 there through. Each of the gasket parts 14 for screw hole hermetically seals a screw hole (or a female screw) of the shielding member 4.

In the gasket main body 11, a flow path gasket part 12 which has a straight line shape and joins the central part of the left side to the center part of the rectangle (the gasket main body 11) is formed. A circle-shaped screw hole gasket part 15 is formed at a tip of the flow path gasket part 12. In addition, a screw hole 13 is formed in the center of the screw hole gasket part 15 to pass a screw 41 there through.

In the present embodiment, polyimide is used as the material of the gasket main body 11. However, the material of the gasket main body 11 is not limited to polyimide. For example, another resin other than polyimide or rubber such as nitrile rubber (NBR) may be used.

(Tape Fiber)

The tape fibers 2 are formed integrally with the gasket main body 11 so as to cross the bottom side of the gasket main body 11. In other words, the tape fiber 2 is formed by molding a plurality of optical fibers 22 integrally with the gasket main body 11 by using polyimide. One end of the tape fiber 2 is located outside the gasket main body 11, whereas the other end of the tape fiber 2 is located inside the gasket main body 11. The tape fiber 2 takes the shape of a long and slender rectangle in section, and has the same thickness as that of the gasket main body 11 inclusive of parts crossing the gasket main body 11. In the present embodiment, six tape fibers 2 are disposed at equal intervals.

In the present embodiment, the tape fiber 2 including the optical fibers 22 is used as the optical transmission means. However, the optical transmission means is not restricted to the tape fiber 2. For example, an optical waveguide sheet including optical waveguides may be used as the optical transmission means.

The tape fiber 2 is connected at each end to an optical connector 21. This facilitates connection to the optical elements 92 such as light emitting elements and light receiving elements.

It is desirable that the optical connectors 21 are connected so as to hermetically seal the inside of the optical transmission means (for example, a gap between the optical waveguide and a covering member which covers the optical waveguide, or a gap between the optical fiber 22 and a covering member which covers the optical fiber 22). Even if the optical transmission means is an optical cable having a twisted wire structure of optical fibers, connecting the optical connectors 21 so as to hermetically seal the inside makes it possible to more certainly prevent a trouble that the inside and outside of the shielding member 4 communicate with each other via gaps between twisted wires.

In the present embodiment, the tape fiber 2 having polyimide as a covering member is formed by molding the optical fibers 22 with polyimide. However, this is not restrictive. For example, as shown in FIG. 3(c), when forming the gasket main body 11 by using a commercially available tape fiber 2a in which the optical fibers 22 are previously covered by a covering member 23, the gasket main body 11 and the covering member 23 may be joined to each other integrally. Since the material of the gasket main body 11 is polyimide, the seal performance between the gasket main body 11 and the covering member 23 in the tape fiber 2a formed integrally with the gasket main body 11 can be improved at this time.

According to the hermetically sealing member 1 having optical transmission means, optical signals can be transmitted between the inside and the outside of the shielding member 4 while maintaining the hermetically sealed state given by the shielding member 4.

In the hermetically sealing member 1, the material of the gasket main body 11 is one kind, i.e., polyimide. However, this is not restrictive.

An application example of the hermetically sealing member 1 having optical transmission means will now be described with referring to the drawings.

<Application Example>

Figure 3A:
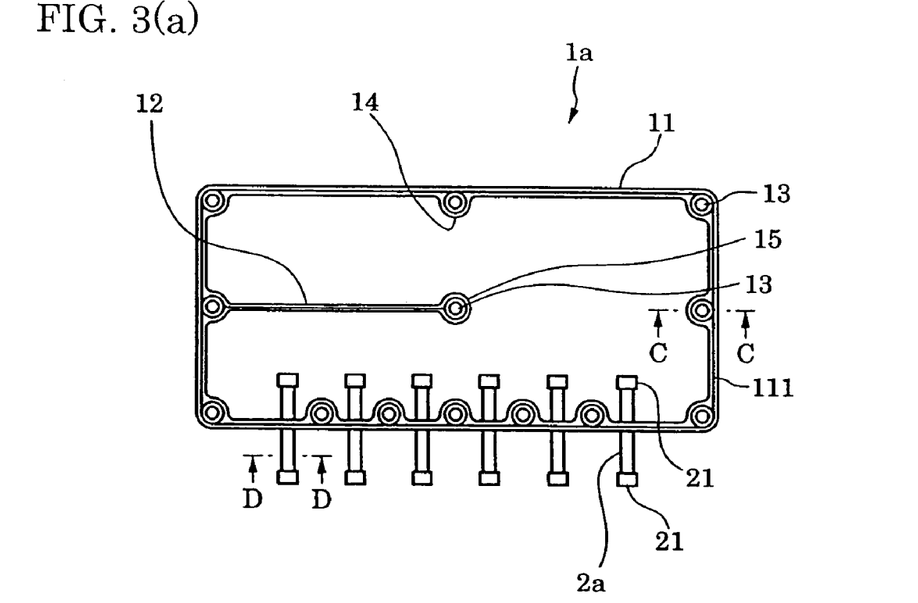
Figure 3B:
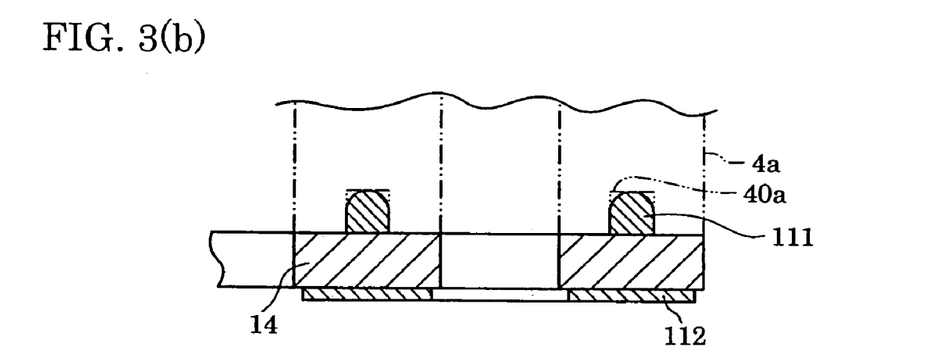
FIG. 3(b) is an expanded sectional view seen along a line C-C.
Figure 3C:
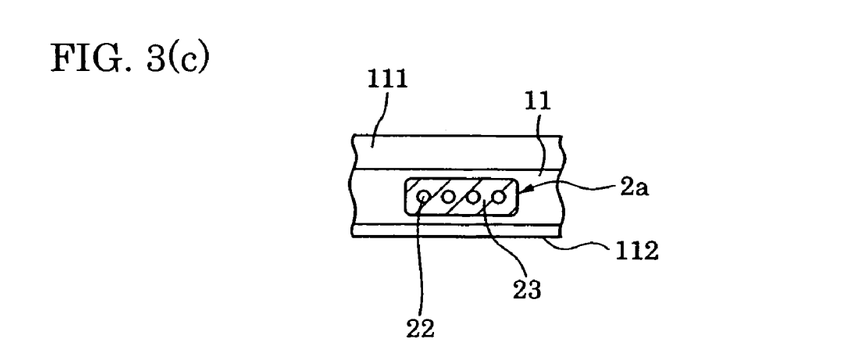
FIG. 3(c) is an expanded sectional view seen along a line D-D.

FIGS. 3(*a*)-3(*c*) are schematic diagrams for explaining a structure of a hermetically sealing member having optical transmission means according to an application example of the present invention, in which FIG. 3(*a*) is a plan view, FIG. 3(*b*) is an expanded sectional view seen along a line C-C, and FIG. 3(*c*) is an expanded sectional view seen along a line D-D.

A hermetically sealing member 1*a* having optical transmission means shown in FIGS. 3(*a*)-3(*c*) differs from the hermetically sealing member 1 according to the above-described embodiment in that a projection part 111 formed of nitrile rubber is provided on a top face of a polyimide layer of the gasket main body 11 and a seal layer 112 formed of nitrile rubber is provided on a bottom face of the gasket main body 11.

Other configurations are made nearly the same as those of the above-described embodiment. Therefore, the same configuration parts as those in FIGS. 1(*a*)-1(*c*) are denoted by the same reference numbers in FIGS. 3(*a*)-3(*c*), and detailed description of them will be omitted.

The hermetically sealing member 1*a* has a structure in which the projection part 111 and the seal layer 112 are connected to the top face and the bottom face of the gasket main body 11. The seal layer 112 comes in contact with the land of the printed-circuit board 3 thereby achieving excellent sealing. The projection part 111 is accommodated in a groove 40*a* which is formed in a seal face of the shielding member 4*a* in a state in which the projection part 111 is pressed. The projection part 111 thus functions as the O ring thereby achieving excellent hermetic sealing.

Accordingly, the seal performance can be further improved by using the hermetically sealing member 1*a* having optical transmission means.

In the hermetically sealing member 1*a*, the projection part 111 and the seal layer 112 are formed integrally with the gasket main body 11. However, the hermetically sealing member 1*a* is not limited to this structure. For example, a structure obtained by superposing the projection part 111 and the seal layer 112 which are separately formed, on and under the gasket main body 11 may be used.

[Optoelectronic Apparatus]

Figure 4A:
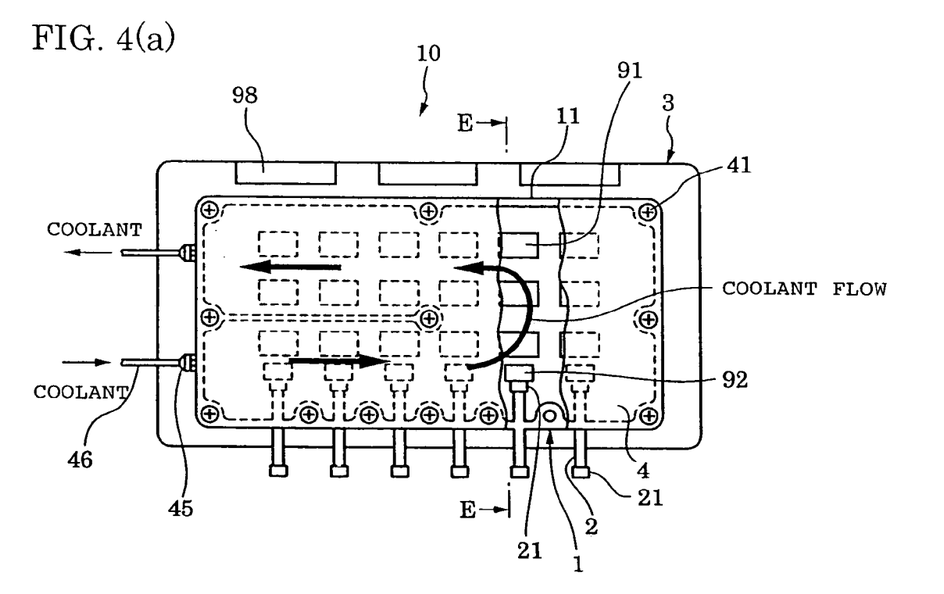
FIG. 4(a) is a plan view.
Figure 4B:
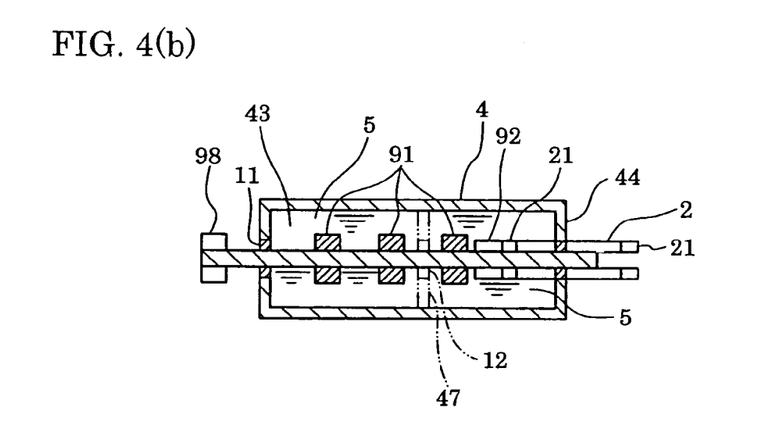
FIG. 4(b) is a sectional view seen along a line E-E.

FIGS. 4(*a*)-4(*b*) are schematic diagrams for explaining a structure of an optoelectronic apparatus according to an embodiment of the present invention, in which FIG. 4(*a*) is a plan view, and FIG. 4(*b*) is a sectional view seen along a line E-E.

In FIGS. 4(*a*)-4(*b*), an optoelectronic apparatus 10 includes the printed-circuit board 3, the shielding member 4, the hermetically sealing member 1 having optical transmission means according to the above-described embodiment, and a coolant 5.

The printed-circuit board 3 according to the present embodiment is a double side mounting board. The hermetically sealing member 1 and the shielding member 4 are disposed on both sides of the printed-circuit board 3.

(Printed-Circuit Board)

Lands (not illustrated) having a shape corresponding to the gasket main body 11 are formed at positions (of both sides) of the printed-circuit board 3 which come in contact with the gasket main body 11. In addition, through holes (not illustrated) that allow the screws 41 for fixing the shielding member 4 to pass through are formed at a plurality of locations of the printed-circuit board 3. The gasket main body 11 comes in contact with the lands to conduct sealing.

Six optical elements 92 per side are mounted on the printed-circuit board 3 at positions which are located inside the land and which correspond to the optical connectors 21 located inside the hermetically sealing member 1. A total of eighteen LSI modules 91 are mounted in six rows by three columns so as to correspond to the optical elements 92. In addition, three connectors 98 are mounted in a peripheral part of the printed-circuit board 3 located outside the land and in the opposite side to the optical elements 92. By the way, the mounting positions of the optical elements 92, the LSI modules 91 and the connectors 98 are not limited to the above-described positions.

(Shielding Member)

The shielding member 4 is a rectangular flat plate made of aluminum. The shielding member 4 has a concave part 43 to accommodate the optical elements 92 and the LSI modules 91 mounted on the printed-circuit board 3. The flat plate has an external shape which coincides with an external shape of the gasket main body 11. A contour of the concave part 43 has a shape identical to the inside shape of the gasket main body 11. In other words, the shielding member 4 includes side walls 44 corresponding to the gasket main, body 11 and the screw hole gasket part 14, and a partition wall 47 corresponding to the flow path gasket part 12 and the screw hole gasket part 15 similar to the example of FIG. 3(*a*). As for the shielding member 4, end faces (seal faces) of the side walls 44 and the partition wall 47 come in contact with the gasket main body 11 to conduct sealing.

As for the shielding member 4 located above the printed-circuit board 3, a screw hole (not illustrated) through which a screw 41 passes is formed in a position corresponding to a screw hole 13 of the gasket main body 11.

On the other hand, as for the shielding member 4 located below the printed-circuit board 3, a female screw (not illustrated) into which a screw 41 is screwed is formed in a position corresponding to a screw hole 13 of the gasket main body 11.

As for the shielding member 4, pipes 46 are connected to vicinities of both ends of the side wall 44 having the partition wall 47 via joints 45. A coolant is supplied from one pipe 46, and the supplied coolant is discharged from the other pipe 46.

As for the shielding member 4, a flow path which is roughly U-shaped is formed because of the partition wall 47. In other words, the coolant 5 supplied from one of the pipe 46 goes nearly straight in one of insides of the shielding member 4 partitioned by the partition wall 47, then performs U-turn, goes nearly straight so as to return in the other of the insides of the shielding member 4 partitioned by the partition wall 47, and discharged from the other pipe 46.

Although not illustrated, preferably unevenness may be provided on the shielding member 4 to form the flow path of the coolant 5 with higher precision. In other words, the LSI modules 91 which generate a large amount of heat can be deprived of a large amount of heat by generating the unevenness so as to expose the LSI modules 91 to a fast flow. By doing so, cooling according to each LSI module 91 can be conducted and effective cooling can be conducted.

Since the tape fiber 2 located inside the gasket main body 11 is exposed to the flow of the coolant 5, it is desirable to provide a retaining part (not illustrated) in the shielding member 4 to retain the tape fiber 2 so as to press down the tape fiber 2. By doing so, it is possible to prevent a trouble that the tape fiber 2 will be damaged by the coolant 5 even if the flow of the coolant 5 becomes fast.

(Coolant)

As for the coolant 5, a liquid coolant (for example, FLUO-RINERT (registered trademark of the 3M Corporation) which is a non-conductive and inactive liquid) is used to effectively cool the LSI modules 91. By the way, the coolant 5 is not restricted to the above-described FLUORINERT.

In the present embodiment, the object to be sealed by the shielding member 4 and the hermetically sealing member 1 having optical transmission means is the coolant 5 which flows through the inside of the shielding member 4. However, the object is not restricted to the coolant 5. In other words, the optoelectronic apparatus 10 is also effective to prevent gas or liquid from leaking out from the inside of the shielding member 4 to the external or to prevent gas or liquid from intruding from the external of the shielding member 4 to the inside.

An assembly procedure and operation of the optoelectronic apparatus 10 having the above-described configuration will now be described.

(Assembly Procedure)

First, the printed-circuit board 3 is turned over, and the hermetically sealing member 1 having optical transmission means is placed on the back surface of the printed-circuit board 3 so as to position the gasket main body 11 on the land. Subsequently, the optical connectors 21 are connected to the optical elements 92, and the shielding member 4 having female screws formed thereon is placed on the gasket main body 11. Subsequently, the printed-circuit board 3, the hermetically sealing member 1 and the shielding member 4 which are superposed are turned over again while maintaining the superposed state, so that the front surface of the printed-circuit board 3 faces upward. Although not illustrated, it is desirable to form positioning holes in a plurality of places of the printed-circuit board 3 and the gasket main body 11 and insert positioning into the positioning holes on the shielding member 4. As a result, positioning of the hermetically sealing member 1 and the shielding member 4 can be conducted with high precision and with ease, and position misalignment can be prevented when it is turned over.

Subsequently, the hermetically sealing member 1 having optical transmission means is placed on the front surface of the printed-circuit board 3 so as to position the gasket main body 11 on the land. Subsequently, the optical connectors 21 are connected to the optical elements 92. In addition, the shielding member 4 having screw holes is placed on the gasket main body 11, and screws 41 are inserted into the screw holes and fastened. As a result, the shielding member 4, the hermetically sealing member 1, the printed-circuit board 3, the hermetically sealing member 1 and the shielding member 4 are connected to one another, and assembling of the optoelectronic apparatus 10 is completed. Consequently, the gasket main body 11 is sandwiched between the land of the printed-circuit board 3 and the seal face of the shielding member 4 and the gasket main body 11 adheres tightly to the land and the seal face. As a result, the gasket main body 11 hermetically seals the inside of the shielding member 4.

(Operation)

In the optoelectronic apparatus 10, the coolant 5 is supplied from one of the pipes 46, flows along a flow path formed by the shielding member 4, and discharged from the other of the pipes 46. Power and electric signals are input via the connectors 98. Subsequently, power for activating the optoelectronic apparatus 10 is input from the connector 98, optical signals are input from the optical connectors 21 exposed to the external, and a large amount of signals are input to the LSI modules 91 via the tape fiber 2, inside optical connectors 21, and the optical elements 92. And the LSI modules 91 are cooled by the coolant 5, and a large amount of signals are processed without being overheated. The LSI modules 91 output signals obtained by conducting the processing, as optical signals from the optical connectors 21 exposed to the external via the optical elements 92, the inside optical connectors 21, and the tape fibers 2.

Even if, for example, breakage occurs in the tape fiber 2 or the optical connector 21 is damaged during operation, the optoelectronic apparatus 10 can be disassembled easily by tracing back the assembling procedure and the faulty hermetically sealing member 1 having optical transmission means can be replaced with a normal hermetically sealing member 1 having optical transmission means. Therefore, the trouble such as the utility impairment is prevented.

According to the optoelectronic apparatus 10 in the present embodiment, the LSI modules 91 and the optical elements 92 mounted on the printed-circuit board 3 can be cooled with high efficiency and precision. Furthermore, optical signals can be transmitted between the inside and the outside of the shielding member 4 while maintaining the hermetically sealed state given by the shielding member 4.

The optoelectronic apparatus 10 is effective as an electronic apparatus of a liquid cooling scheme which conducts processing on optical signals. The optoelectronic apparatus 10 is also extremely effective as a test apparatus for testing the printed-circuit board 3 on which the LSI modules 91 and the optical elements 92 to be tested are mounted. The reason is as follows: the optoelectronic apparatus 10 has a structure which can be assembled and disassembled easily; and even if the tape fiber 2 or the optical connector 21 is damaged, the hermetically sealing member 1 having optical transmission means can be exchanged without scrapping the printed-circuit board 3.

[Optical Transmission Method]

The present invention is effective as an optical transmission method as well. An optical transmission method according to an embodiment will now be described.

The optical transmission method according to the present embodiment is a process operated in the optoelectronic apparatus 10. This optical transmission method is used when the optical elements 92 mounted on the printed-circuit board 3 which are covered by the shielding member 4 and which are cooled by the coolant 5 supplied to the space between the shielding member 4 and the printed-circuit board 3 transmit optical signals to the outside of the shielding member 4 or receive optical signals from the outside of the shielding member 4. Furthermore, this optical transmission method is a method by which optical signals are transmitted or received via the tape fibers 2 formed integrally with the hermetically sealing member 1 having optical transmission means attached to seal faces of the printed-circuit board 3 and the shielding member 4.

According to the optical transmission method in the present embodiment, optical signals can be thus transmitted between the inside and the outside of the shielding member 4 while maintaining the hermetically sealed state established by the shielding member 4.

Heretofore, the hermetically sealing member having optical transmission means, the optoelectronic apparatus and the optical transmission method according to the present invention have been described with reference to the preferred embodiments. However, it is a matter of course that the hermetically sealing member having optical transmission means, the optoelectronic apparatus and the optical transmission method according to the present invention are not limited to the above-described embodiments, but various changes can be made without departing from the scope of the present invention.

For example, the optoelectronic apparatus 10 has a structure in which double side mounting is conducted on the printed-circuit board 3. However, the present invention is not limited to this particular structure. For example, the optoelectronic apparatus 10 is effective to a printed-circuit board 3 of single side mounting as well.

INDUSTRIAL APPLICABILITY

As heretofore described, the hermetically sealing member having optical transmission means, the optoelectronic apparatus and the optical transmission method according to the present invention are not restricted to the case where the coolant is sealed, but they can be applied widely to various uses in which optical signals are transmitted through a sealed space.

The invention claimed is:

1. A hermetically sealing structure, comprising:
   a hermetically sealing member which is a gasket for establishing sealing and is attached to seal faces of a printed-circuit board having optical elements mounted thereon;
   a shielding member which shields at least a part of components mounted on the printed-circuit board, said hermetically sealing member being sandwiched by said shielding member and said printed-circuit board;
   optical transmission means formed integrally with the hermetically sealing member to transmit optical signals between inside and outside of the shielding member; and
   a flow path gasket part formed integrally with the hermetically sealing member having a straight line shape extending inwardly within said hermetically sealing member to control a flow passage of coolant introduced in a space formed between the printed-circuit board and the shielding member.

2. The hermetically sealing structure according to claim 1, wherein optical connectors are connected to both ends of the optical transmission means.

3. The hermetically sealing structure according to claim 1, wherein the hermetically sealing member is made of at least one of resin and rubber formed with a shape corresponding to the shielding member.

4. The hermetically sealing structure according to claim 3, further comprising a projection part formed on at least one of a top face and a bottom face of the hermetically sealing member.

5. An optoelectronic apparatus comprising:
   a printed-circuit board on which optical elements are mounted;
   a shielding member which shields the printed-circuit board and at least a part of components mounted on the printed-circuit board; and
   a hermetically sealing member which is a gasket for establishing sealing and is attached to seal faces of the printed-circuit board, said hermetically sealing member being sandwiched by said shielding member and said printed-circuit board;
   optical transmission means formed integrally with the hermetically sealing member to transmit optical signals between inside and outside of the shielding member; and
   a flow path gasket part formed integrally with the hermetically sealing member having a straight line shape extending inwardly within said hermetically sealing member to control a flow passage of coolant introduced in a space formed between the printed-circuit board and the shielding member.

6. The optoelectronic apparatus according to claim 5, wherein the coolant which cools electronic components mounted on the printed-circuit board is supplied to the space between the shielding member and the printed-circuit board via pipes formed on the shielding member, and the hermetically sealing member hermetically seals the coolant.

7. The optoelectronic apparatus according to claim 6, wherein unevenness which forms a flow path of the coolant is provided on the shielding member.

8. The optoelectronic apparatus according to claim 6, wherein a retaining part which retains the optical transmission means is provided on the shielding member.

9. An optical transmission method used for optical elements comprising the following steps of:
   providing a printed-circuit board on which optical elements are mounted;
   attaching a hermetically sealing member to seal faces of the printed-circuit board where the hermetically sealing member is a gasket for establishing sealing;
   mounting a shielding member which shields the printed-circuit board and at least a part of components mounted on the printed-circuit board in a manner to sandwich said hermetically sealing member between said shielding member and said printed-circuit board;
   transmitting optical signals through optical transmission means formed integrally with the hermetically sealing member between inside and outside of the shielding member; and
   controlling a flow passage of coolant introduced in a space formed between said printed-circuit board and said shielding member for cooling the optical elements by a flow path gasket part is formed integrally with the hermetically sealing member where the flow path gasket part has a straight line shape extending inwardly within the hermetically sealing member.

* * * * *